(12) United States Patent
Ananthan

(10) Patent No.: US 8,674,434 B2
(45) Date of Patent: Mar. 18, 2014

(54) IMPACT IONIZATION DEVICES

(75) Inventor: Venkatesan Ananthan, Santa Clara, CA (US)

(73) Assignee: Micron Technology, Inc., Boise, ID (US)

( * ) Notice: Subject to any disclaimer, the term of this patent is extended or adjusted under 35 U.S.C. 154(b) by 658 days.

(21) Appl. No.: 12/053,977

(22) Filed: Mar. 24, 2008

(65) Prior Publication Data

US 2009/0236657 A1  Sep. 24, 2009

(51) Int. Cl.
*H01L 29/76* (2006.01)
(52) U.S. Cl.
USPC ..... 257/330; 257/332; 257/322; 257/E27.078
(58) Field of Classification Search
USPC .......... 438/270, 589, 380, 286; 257/320–322, 257/330–332, E27.078
See application file for complete search history.

(56) References Cited

U.S. PATENT DOCUMENTS

| | | | |
|---|---|---|---|
| 5,489,792 A | 2/1996 | Hu et al. | |
| 5,877,056 A | 3/1999 | Wu | |
| 5,918,115 A * | 6/1999 | Kikuchi et al. | 438/138 |
| 6,121,666 A * | 9/2000 | Burr | 257/408 |
| 6,133,099 A | 10/2000 | Sawada | |
| 6,232,822 B1 | 5/2001 | Sakui et al. | |
| 6,268,242 B1 | 7/2001 | Williams et al. | |
| 6,313,487 B1 * | 11/2001 | Kencke et al. | 257/192 |
| 6,406,973 B1 | 6/2002 | Lee | |
| 6,593,196 B2 | 7/2003 | Akram et al. | |
| 7,033,891 B2 | 4/2006 | Wilson et al. | |
| 7,056,761 B1 * | 6/2006 | Vashchenko et al. | 438/91 |
| 7,084,456 B2 | 8/2006 | Williams et al. | |
| 7,119,397 B2 | 10/2006 | Fischer et al. | |
| 7,189,606 B2 | 3/2007 | Wang et al. | |
| 7,253,060 B2 * | 8/2007 | Yun et al. | 438/284 |
| 2004/0012057 A1 * | 1/2004 | Bennett et al. | 257/414 |
| 2004/0259312 A1 * | 12/2004 | Schlosser et al. | 438/270 |
| 2005/0035398 A1 * | 2/2005 | Williams et al. | 257/329 |
| 2005/0224897 A1 | 10/2005 | Chen et al. | |
| 2006/0113612 A1 * | 6/2006 | Gopalakrishnan et al. | 257/392 |
| 2006/0125041 A1 | 6/2006 | Yang et al. | |
| 2006/0214221 A1 * | 9/2006 | Challa et al. | 257/328 |
| 2006/0220086 A1 * | 10/2006 | Charbuillet et al. | 257/296 |
| 2007/0029607 A1 * | 2/2007 | Kouznetzov | 257/321 |
| 2008/0001198 A1 * | 1/2008 | Jeon et al. | 257/298 |
| 2008/0197406 A1 * | 8/2008 | Parthasarathy et al. | 257/329 |
| 2008/0272429 A1 * | 11/2008 | Ishiguro | 257/330 |
| 2009/0026553 A1 * | 1/2009 | Bhuwalka et al. | 257/402 |

FOREIGN PATENT DOCUMENTS

WO  WO2007008173  1/2007

OTHER PUBLICATIONS

Irisawa et al.—IEEE Transactions on Electron Devices, v. 52, 2005.*
S.M. Sze "Semiconductor Devices. Physics and Technology. 2nd Edition", (C) 2002, John Wiley and Sons.*

(Continued)

Primary Examiner — H. Jey Tsai
(74) Attorney, Agent, or Firm — TraskBritt

(57) ABSTRACT

Impact ionization devices including vertical and recessed impact ionization metal oxide semiconductor field effect transistor (MOSFET) devices and methods of forming such devices are disclosed. The devices require lower threshold voltage than conventional MOSET devices while maintaining a footprint equal to or less than conventional MOSFET devices.

18 Claims, 9 Drawing Sheets

(56) References Cited

OTHER PUBLICATIONS

Gopalakrishnan et al., Impact Ionization MOS (I-MOS)—Part I: Device and Circuit Simulations, IEEE Transactions on Electron Devices, vol. 52, No. 1, Jan. 2005, pp. 69-76.

Gopalakrishnan et al., Impact Ionization MOS (I-MOS)—Part II: Experimental Results, IEEE Transactions on Electron Devices, vol. 52, No. 1, Jan. 2005, pp. 77-84.

Ouyang et al, Built-in Longitudinal Field Effects in Sub-100-nm Graded Si1-xGex Channel PMOSFETs, IEEE Transactions on Electron Devices, vol. 48, No. 6, Jun. 2001, pp. 1245-1250.

Toh et al., A Strained N-channel Impact-ionization MOS (I-MOS) Transistor with Elevated Silicon-Carbon Source/Drain for Performance Enhancement, IEEE, 2007, 2 pages.

Abelein et al., Doping Profile Dependence of the Vertical Impact Ionization MOSFET's (I-MOS) Performance, 1 page.

Bjork et al., Vertical Surround-gated Silicon Nanowire Impact Ionization Field-Effect Transistors, Applied Physics Letters, vol. 90, 2007, 3 pages.

Charbuillet et al., High Current Drive in Ultra-Short Impact Ionization MOS (I-MOS) Devices, IEEE, 2006, 3 pages.

Choi et al, 80nm Self-Aligned Complementary I-MOS Using Double Sidewall Spacer and Elevated Drain Structure and Its Applicability to Amplifiers with High Linearity, IDDD, 2004, pp. 203-206.

Choi et al., A Novel Biasing Scheme for I-MOS (Impact-Ionization MOS) Devices, IEEE Transactions on Nanotechnology, vol. 4, No. 3, May 2005, pp. 322-325.

Abelein et al., Improved Reliability by Reduction of Hot-Electron Damage in the Vertical Impact-Ionization MOSFET (I-MOS), IEEE Electron Device Letters, vol. 28, No. 1, Jan. 2007, pp. 65-97.

Choi et al, 70-nm Impact-Ionization Metal-Oxide-Semiconductor (I-MOS) Devices Integrated with Tunneling Field-Effect Transistors (TFETs), IEEE, 2005, 4 pages.

Gopalakrishnan et al., I-MOS: A Novel Semiconductor Device with a Subthreshold Slope Lower than kT/q, IEEE, 2002, pp. 289-292.

* cited by examiner

IMPACT IONIZATION DEVICES

TECHNICAL FIELD

Embodiments of the invention relate to impact ionization devices, such as semiconductor devices that include impact ionization metal oxide semiconductor field effect transistors (MOSFET), and to methods of making the same.

BACKGROUND

Metal oxide semiconductor (MOS) structures are basic electronic devices used in many integrated circuits. One such structure is the MOSFET, or metal oxide field effect transistor, which is conventionally formed in a semiconductor substrate by providing a gate structure over a channel region provided in a substrate, and by forming doped source and drain regions on opposing sides of the gate structure and the channel region of the substrate.

FIG. 1 illustrates a portion of a conventional MOSFET memory array device 5 comprising a single transistor. A conventional MOSFET memory array device 5 includes a gate structure 10 on a substrate 8. The substrate 8 is conventionally a bulk silicon substrate. The gate structure 10 conventionally includes a gate oxide 12, a conductive polysilicon layer 14, an overlying WSi$_x$ layer 16, an overlying oxide layer 18 and a Si$_3$N$_4$ capping layer 20. After depositing and patterning Si$_3$N$_4$ capping layer 20, spacers 40, 42 are formed from silicon nitride. Optional oxidized sidewalls 22, 24 may be formed on the gate structure 10, and optional oxide regions 26, 28 may be formed on the substrate 8. An ion implantation step may be performed to form source and drain regions 30, 32, which are both aligned to the edge of the gate structure 10.

To keep pace with the current trend toward maximizing the number of circuit devices contained in a single chip, integrated circuit designers continue to design integrated circuit devices with smaller feature sizes. However, as MOSFET devices are scaled down to the nanoscale region, critical problems can arise. One of the fundamental problems in continued scaling of MOSFETs is the 60 mV/decade room temperature limit for the subthreshold slope.

Devices have been proposed that use impact ionization to switch from the off to the on state. Such impact ionization devices may exhibit a subthreshold slope much lower than kT/q. The basic structure of a conventional impact ionization MOSFET device (I-MOS) 5' is shown in FIG. 2. A gate stack 10' is patterned and flanked by offset spacers 43. The source area 46 is masked while the drain 44 is formed. Secondary spacers 50 are formed to create the intrinsic region 52. Then, the drain area is masked while the source area 46 is implanted. While conventional MOSFET devices are doped NPN or PNP (source-drain-channel), I-MOS devices are NNP or PPN with the channel being more lightly doped an the source or drain.

Unfortunately, a planar I-MOS device 5' requires more space on a chip surface as compared to conventional MOSFET devices having the same gate length. Thus, L-shaped impact ionization transistors were created. However, such L-shaped transistors are formed using a complicated process flow. Conventional I-MOS devices operated at higher voltages than conventional MOSFET devices. Thus, impact ionization regions are preferably formed of germanium or silicon germanium, which lowers the required threshold voltage, but such materials are difficult to incorporate into conventional AMOS devices using current processing techniques. Thus, it would be desirable to create an I-MOS structure than can be manufactured using a relatively straightforward process flow and of a design that does not exceed, or only slightly exceeds, the dimensions of conventional MOSFET devices.

DETAILED DESCRIPTION

The following description provides illustrative examples of embodiments of devices and methods of the invention with reference to the drawings. Such description is for illustrative purposes only and is non-limiting of the scope of the invention. Other embodiments of devices and methods may be implemented in accordance with the invention.

Embodiments of ionization devices including recessed or vertical structures for I-MOS devices are disclosed. Such structures enable methods of fabricating I-MOS devices without any extensive increase in process complexity relative to those employed in fabricating conventional MOSFET devices. In some embodiments of the invention, germanium or silicon germanium forms the impact ionization region, which may reduce the threshold voltage of the I-MOS and reduce or eliminate the need for any voltage biasing schemes.

In conventional MOSFET devices, the source and drain regions are aligned with (or even partially underlie) the gate. Thus, no separation exists between the gate edge and either the source or drain. By contrast, embodiments of impact ionization devices of the invention may have a gap between the source region and the gate. In conventional MOSFET devices, the source and drain regions are both either N+ type or P+ type. By contrast, the source and drain regions of embodiments of I-MOS devices of the invention have source and drain regions doped of opposite type. In other words, the source region may be either an N+ type or P+ type as long as the drain region is oppositely doped.

Figure 1:
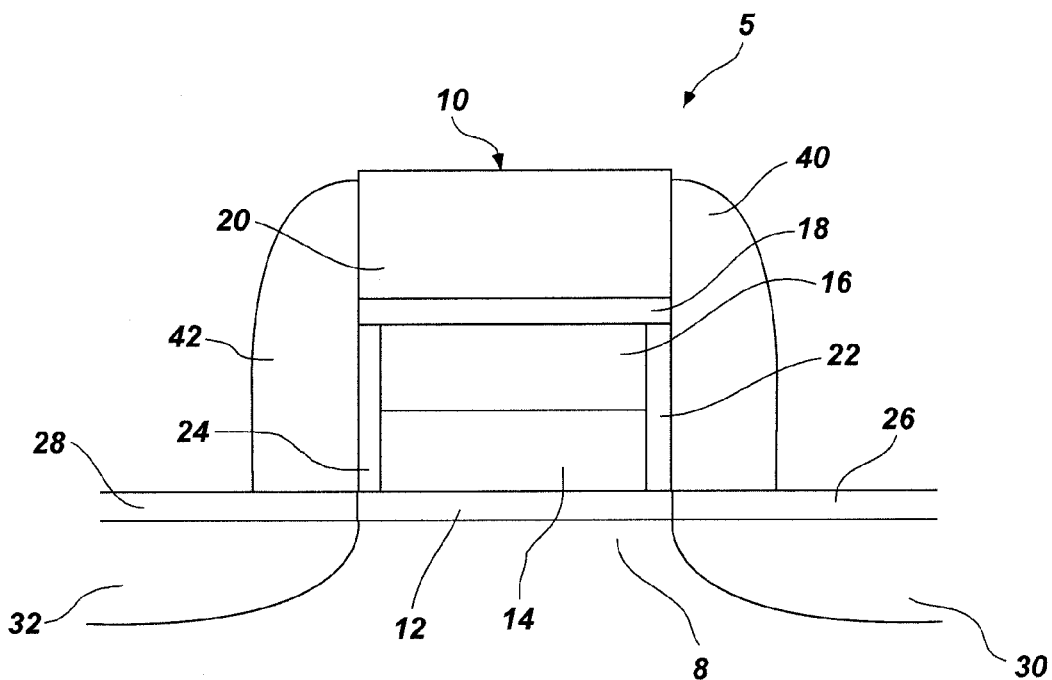
FIG. 1 is a cross-sectional view of a conventional MOSFET device.
Figure 2:
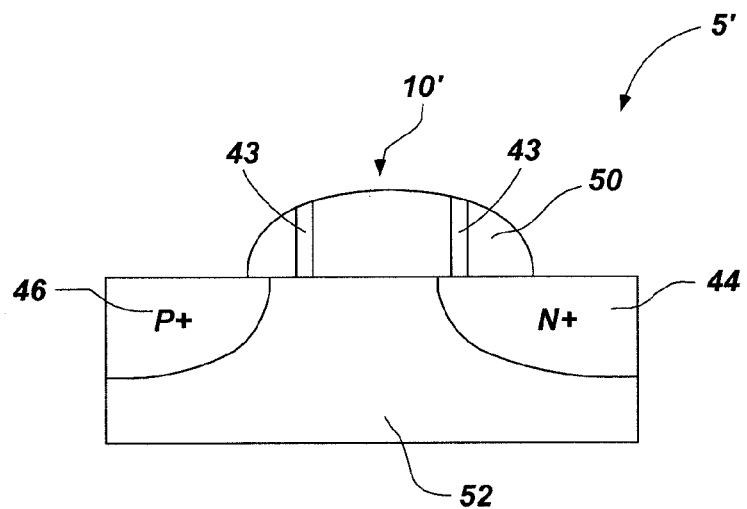
FIG. 2 is a cross-sectional view of a conventional I-MOS device.
Figure 3:
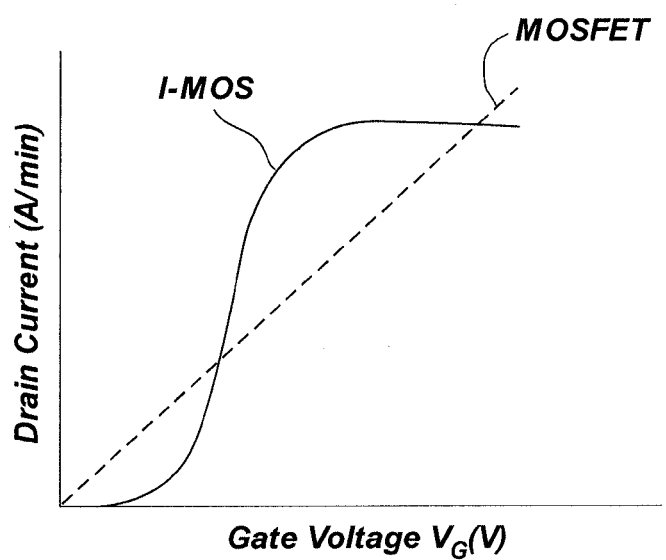
FIG. 3 illustrates the dram current as a function of the voltage applied to the gate for both a conventional MOSFET device and an embodiment of an AMOS transistor of the invention.

Referring to FIG. 3, the subthreshold slope of a conventional MOSFET and an I-MOS device according to an embodiment of the invention are compared. The rate at which the transistor goes from an "off" state to an "on" state is faster, thus the slope is steeper for the I-MOS device. Impact ionization devices according to embodiments of the invention may have a subthreshold slope of approximately 5 mV/decade or less.

Figure 4:
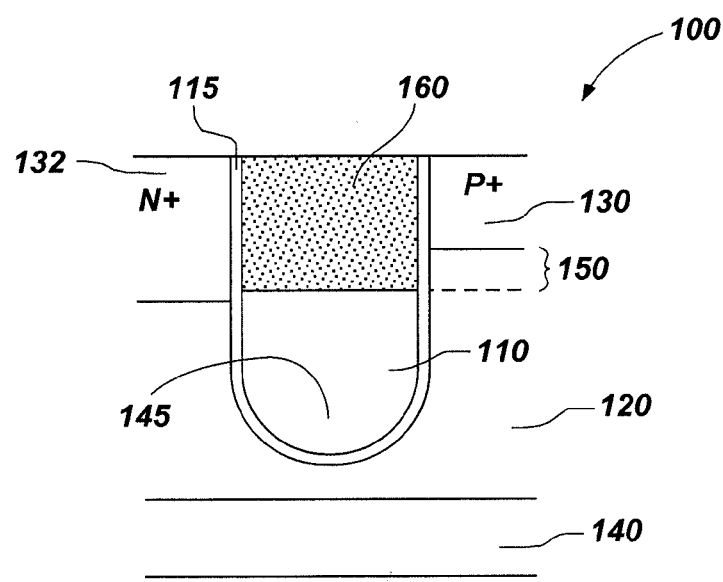
FIG. 4 is a cross-sectional view of an embodiment of a recessed I-MOS transistor of the invention.

Embodiments of the invention include recessed and vertical I-MOS devices. FIG. 4 depicts a portion of an example of an embodiment of an impact ionization device 100 of the invention and illustrates one transistor of a recessed I-MOS. The impact ionization device 100 may, in fact, comprise many such transistors (and other associated circuit components such as, for example, capacitors, conductive lines, conductive pads, etc.). The impact ionization device 100 may include a substrate 120, which may comprise a buried oxide layer 140 therein in some embodiments. A gate oxide 115 is formed in a trench 145 in the substrate 120. A gate 110 is formed in the trench 145, and a cap 160 of insulating or non-conducting material covers the gate 110 and may fill the trench 145. The transistor includes P+ doped source region 130. The source region 130 is formed on one side of the gate 110 and extends into the substrate 120. The source region 130 terminates before reaching the full depth of the gate 110. The transistor also includes an N+ doped drain region 132 that is formed on the opposite side of the trench from the source region 130 and also extends into the substrate 120. The drain region 132, like the source region 130, terminates before reaching the full depth of the gate 110. The drain region 132, however, extends deeper into the substrate 120 than the source region 130. The source region 130 and drain region 132 are separated by the gate 110 and, together with the region of the substrate 120 adjacent the gate 110, provide the current path for the impact ionization current. In this configuration, an impact ionization region 150 is provided between a lower boundary of the source region 130 and an upper boundary of the gate 110. As shown in FIG. 4, the impact ionization region 150 may be substantially rectangular.

Figure 5:
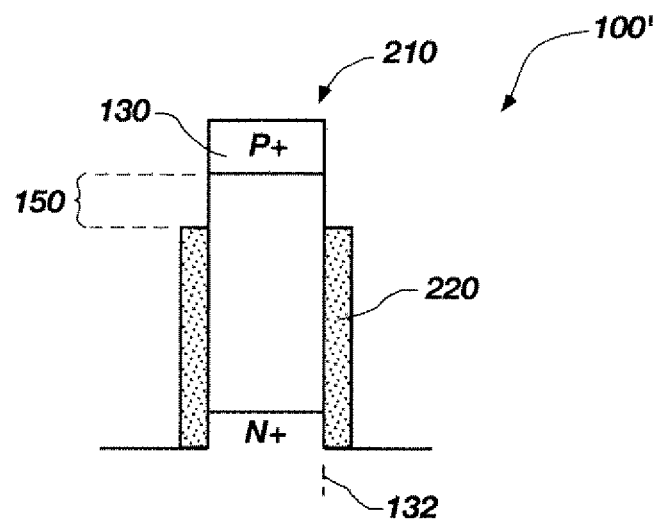
FIG. 5 is a cross-sectional view of an embodiment of a vertical I-MOS transistor of the invention.

FIG. 5 depicts an example of an embodiment of an impact ionization device 110' of the invention comprising a vertical I-MOS. A silicon pillar 210 includes a lower N+ drain region 132 and an upper P+ source region 130. The silicon pillar 210 may be flanked by a gate 220 formed from gate material. The gate 220 may surround the silicon pillar 210. In other words, gate material may be formed on one or more lateral surfaces of the silicon pillar 210 to form the gate 220 of the impact ionization device 100'. The gate 220 and the P+ source region 130 do not overlap, and an impact ionization region 150 may be provided in a region between the gate 220 and the source region 130. As shown in FIG. 5, the impact ionization region 150 may be substantially rectangular.

Figure 6:
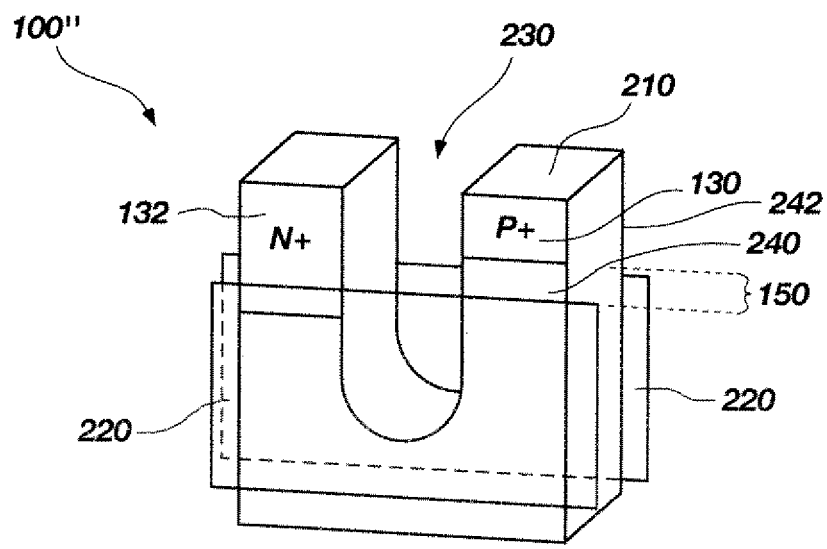
FIG. 6 is a plan view of a vertical cross-hair I-MOS transistor.

FIG. 6 depicts an example of an embodiment of an impact ionization device 100" of the invention comprising a crosshair structure. A silicon pillar 210 includes either an upper N+ drain region 132 or an upper P+ source region 130. The N+ drain region 132 and upper P+ source region 130 may be formed on a distinct silicon pillar 210 and separated by a vertical trench 230. The silicon pillar 210 may be flanked by a gate 220 formed from gate material. The gate 220 may extend on both a first side 240 and second side 242 of the silicon pillar 210. In other words, gate material may be formed on one or more parallel surfaces of the silicon pillar 210 to form the gate 220 of the impact ionization device 100". The gate 220 and the P+ source region 130 do not overlap, and an impact ionization region 150 may be provided in a region between the gate 220 and the source region 130. As shown in FIG. 6, the impact ionization region 150 may be substantially rectangular.

Figure 7A:
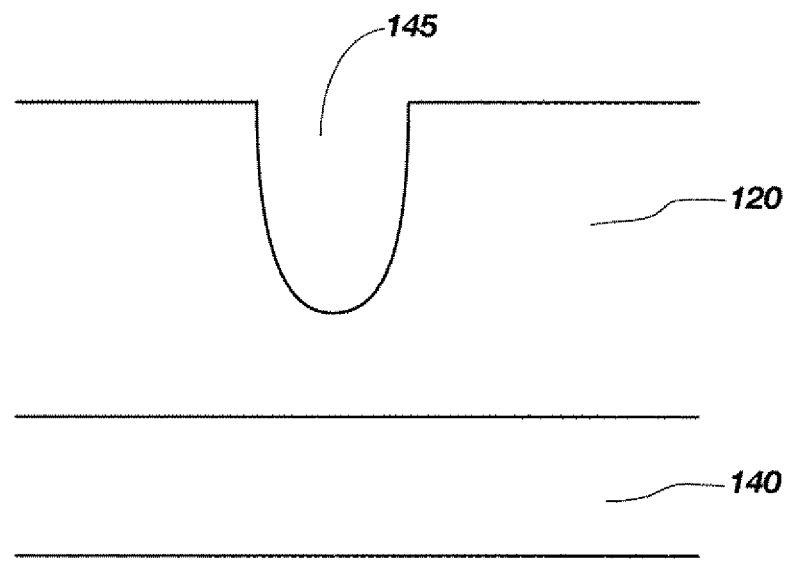
FIGS. 7A-7E are cross-sectional views of a work piece at various stages of an embodiment of a method of forming a recessed I-MOS transistor of the invention.

FIGS. 7A-7E depict an embodiment of a method of the present invention that may be used to form a recessed I-MOS device of embodiments of the present invention, such as the impact ionization device 100 shown in FIG. 4. Referring to FIG. 7A, a substrate 120 is provided. Optionally, the substrate 120 may include a buried oxide layer 140 therein. The substrate 120 may comprise, but is not limited to, a silicon wafer, epitaxial silicon layers, polysilicon layers, bonded wafers such as silicon-on-insulator (SOI) type substrates, and amporphous silicon layers, all of which may be doped or undoped. If the substrate is undoped, it may be doped with a first conductivity type dopant by conventional methods.

Next, a trench 145 may be formed in the substrate 120. The trench 145 may be formed by, for example, any conventional masking and etching process. By way of non-limiting example, the substrate 120 may be masked with an opening overlying the region of the substrate 120 in which the trench 145 will be formed. The material of the substrate 120 in that region may then be removed by etching through the opening in the mask to form the trench 145. The parameters of the etching process may be controlled to form rounded bottom corners, smooth and continuous sidewalls, clean trench bottom surfaces, and a desired trench depth. Conventionally, shallow trench isolation (STI) structures are approximately 2,500 Å deep. The trench 145 may be shallower than any adjacent STI structures. In one particular embodiment set forth as an example, the trench depth may be between approximately 800 Å-1,200 Å. In one embodiment, the trench depth is approximately 1,000 Å. After formation of the trench 145, the mask may be removed by conventional methods (FIG. 7A).

Figure 7B:
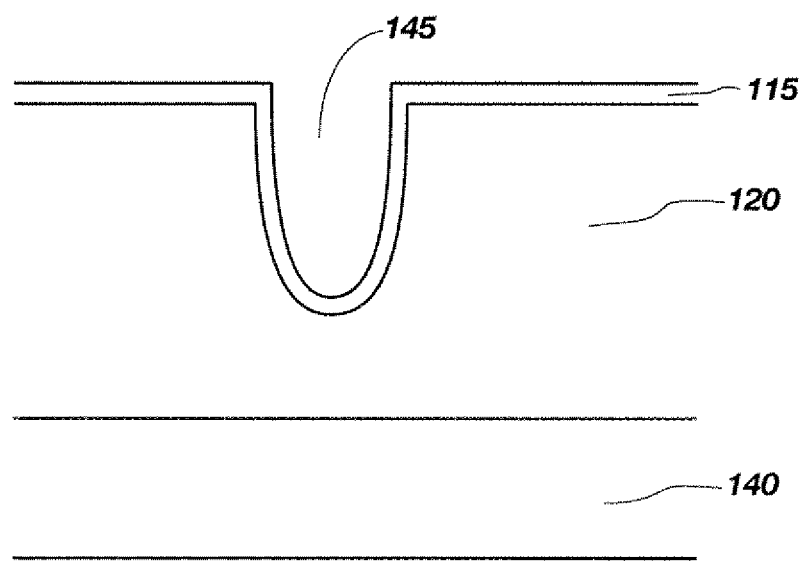

Next, gate dielectric material 115 may be formed over the substrate 120 and within the trench 145, as shown in FIG. 7B. The gate dielectric material 115 may comprise a thin layer of material having a relatively high dielectric constant. As one particular non-limiting example, the gate dielectric material 115 may comprise a silicon oxide ($SiO_2$). In additional embodiments, the gate dielectric material 115 may comprise silicon nitride ($Si_3N_4$), zirconium oxide ($ZrO_2$), hafnium oxide ($HfO_2$), hafnium silicide (HfSi), silicon hafnium oxynitride (SiHfON), hafnium silicate ($HfSiO_4$), lanthanum oxide ($La_2O_3$), or any combinations thereof. The gate dielectric material 115 may be formed by oxidizing or nitriding a surface of the substrate 120, or it may be deposited by chemical vapor deposition, (CVD), atomic layer deposition (ALD), physical vapor deposition (PVD), or by combinations of such processes.

Figure 7C:
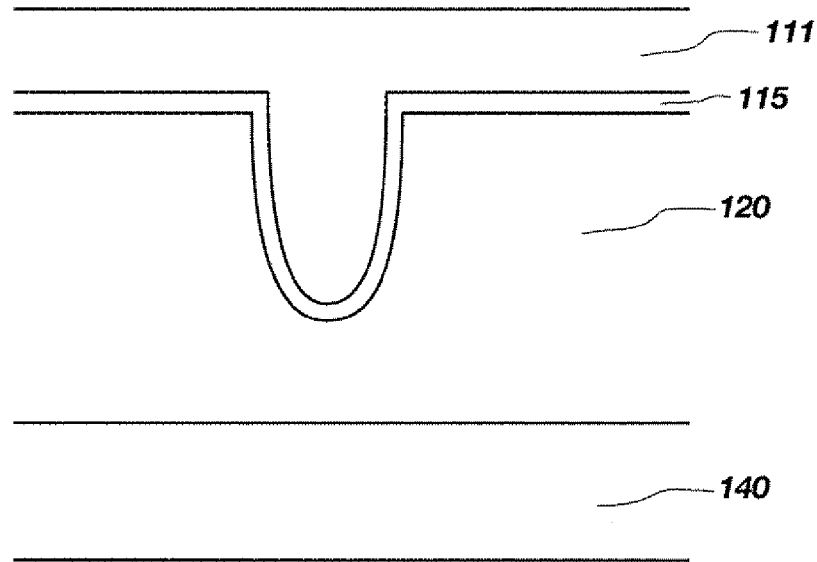

After forming the gate dielectric material 115, the gate 110 may be formed in the trench 145. Referring to FIG. 7C, a layer of gate material 111 may be deposited over the workpiece. The layer of gate material 111 may comprise conductive polysilicon (which may be doped) or any other conductive gate material. The layer of gate material 111 may be formed using, for example, low pressure chemical vapor deposition (LPCVD) or other conventional methods. If the layer of gate material 111 comprises a doped material (e.g., doped polysilicon), he layer of gate material 111 may be doped during formation of the layer of gate material 111 by adding a dopant gas such as phosphine or arsine to the CVD source gas mixture, or the layer of gate material 111 may be doped after forming he layer of gate material 111 by implanting ions into the gate material 111 to render the layer of gate material 111 conductive. In additional embodiments, the gate material 111 may be or comprise other materials, such as TaSiN, TiN, TaN, HfN, WN, MoN, a metal, metal alloys, metal oxides, or any combination thereof (e.g., a multi-layer structure comprising a plurality of layers of such materials), which may prevent a depletion layer from occurring and provide low gate resistance.

Figure 7D:
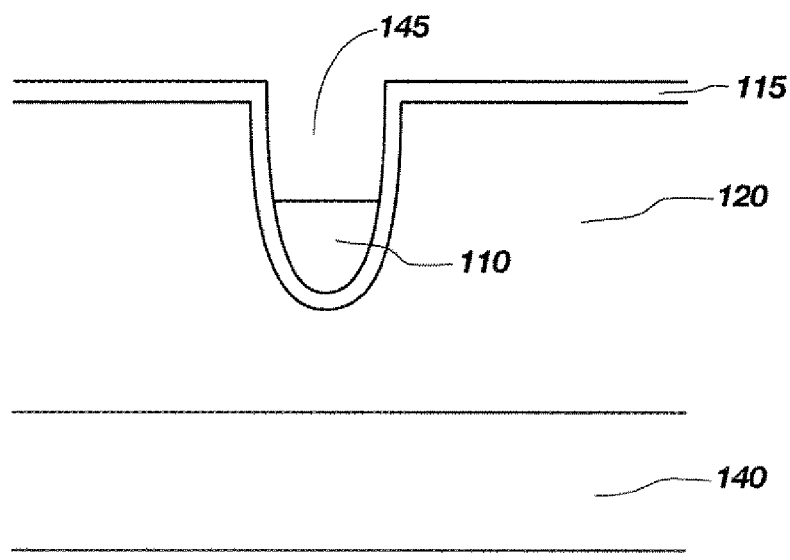
Figure 7E:
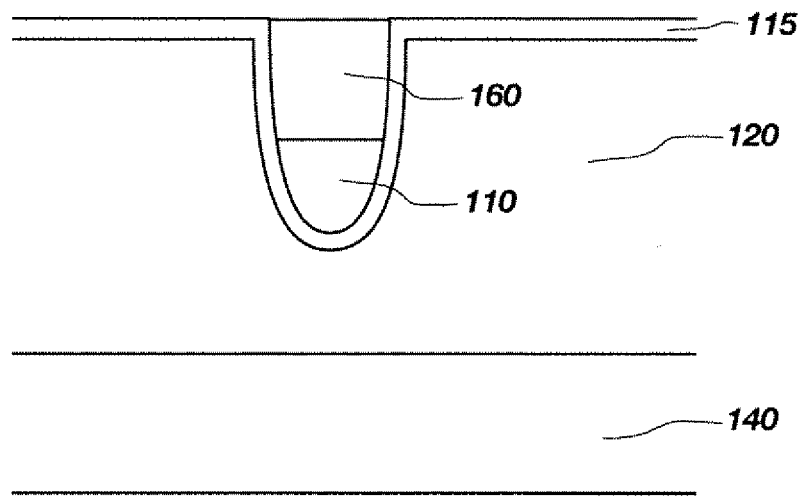

The layer of gate material 111 may be etched by any conventional method such as plasma etching or wet chemical etching to form the gate 110. After etching, the gate 110 may fill approximately one-half the depth of the trench 145. (FIG. 7D). The gate 110 may have a height ranging from approximately 500 Å to approximately 2,000 Å. In one embodiment, (be gate 110 is recessed in a trench and has a height of approximately 500 Å. A cap 160 formed of a non-conducting or insulating material may be deposited over the gate 110 to fill the trench 145, as shown in FIG. 7E. The cap 160 may be formed from a nitride or oxide, such as aluminum oxide. Optionally, the cap 160 may be etched or planarized to be substantially level with the top of the trench 145.

Figure 7F:
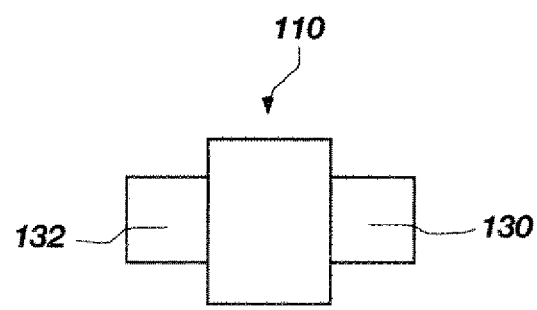
FIG. 7F is a plan view of an embodiment of a recessed I-MOS of the invention.

Dopants may be implanted to form the source and drain regions 130, 132 (FIG. 4) on opposing sides of the gate 110 using doping methods known in the art, such as, for example, ion implantation methods. By way of example and not limitation, a first mask (not shown) may be formed over the impact ionization device 100 such that only the region where the source region 130 (FIG. 4) is to be formed is exposed. Implantation may be provided into the exposed source region 130. The implantation process may be used to form a P+ doped source region 130 that is self-aligned to the edges of the trench 145. P-type dopants conventionally include ions of the elements in Group 13 of the periodic table. For example, the dopant of the source region 130 may comprise boron. The first mask may be removed by conventional methods, and a second mask (not shown) may be formed over the impact ionization device 100 such that only the drain region 132 is exposed. A second, relatively heavy ion implantation may be made self-aligned to the opposite side of the trench 145 with an N-type dopant. N-type dopants conventionally include ions of elements from Group 15 of the periodic table such as, for example, phosphorus, arsenic or antimony. Thus, the source region 130 and the drain region 132 are oppositely doped. The drain region 132 may extend below the cap 160 to abut an upper portion of he gate 110. After forming the drain region 132, the second mask (not shown) may be removed by conventional methods. FIG. 7F is a plan view of a source region 130 and a drain region 132 formed on or in a substrate 120 (FIG. 7A) on opposing sides of a gate 110, as discussed above.

Figure 8:
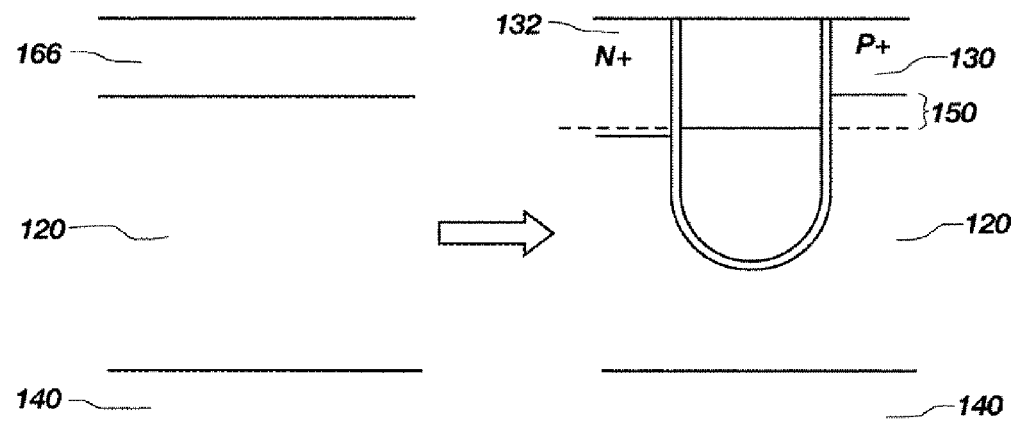
FIG. 8 is a cross-sectional view of an embodiment of a recessed I-MOS transistor of the invention.

The threshold voltage of the impact ionization device 100 may be at least partially determined by the impact ionization coefficients of the material used to make the transistor, and in particular, the material comprising the impact ionization region 150 of the impact ionization device 100. Since silicon has low impact ionization coefficients, the threshold voltage can be high in impact ionization devices in which the impact ionization region 150 comprises a silicon-based material. Complicated biasing schemes have been proposed to address this issue such as, for example, applying a negative voltage to the source region 130. However, applying a negative voltage to the source region 130 may not be ideal. Thus, in some embodiments of the invention, the impact ionization device 100 may comprise a layer of material 166 in the impact ionization region 150 having a high impact ionization rate on a surface of the substrate 120, as shown in FIG. 8. The layer of material 166 preferably has an impact ionization rate greater than silicon. By way of example and not limitation, the layer of material 166 may include any material having an impact ionization rate relatively higher than that of silicon, such as, but not limited to, germanium and silicon germanium alloys. As one particular non-limiting example, the layer of material 166 may comprise a layer of epitaxial silicon germanium (SiGe). Since SiGe has a higher impact ionization rate than silicon, the threshold voltage of the impact ionization device 100 may be lowered relative to previously known I-MOS devices.

By way of example and not limitation, prior to formation of the trench 145, the layer of material 166 may be formed on an upper surface of the substrate 120 such that the trench 145 extends below the layer of material 166 and into the substrate 120. (FIG. 8) In this configuration, the impact ionization region 150 may be substantially comprised of the layer of material 166, as shown in FIG. 8. The N+ drain region 132 may extend below the layer of material 166 and into the substrate 120.

Figure 9A:
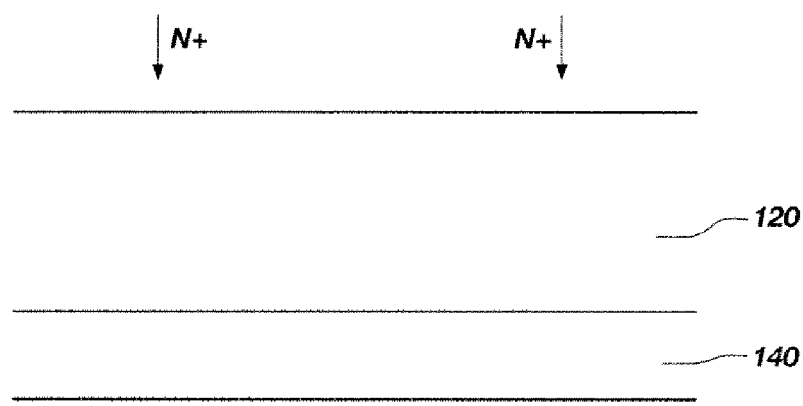
FIGS. 9A-9F are cross-sectional views of a work piece at various stages of an embodiment of a method of forming a vertical I-MOS transistor of the invention.
Figure 9B:
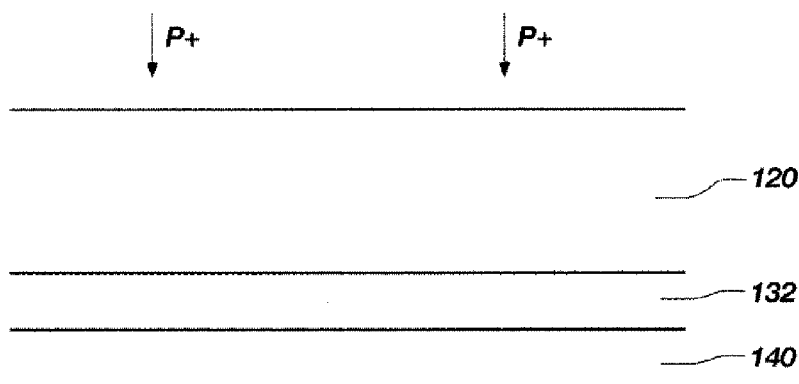
Figure 9C:
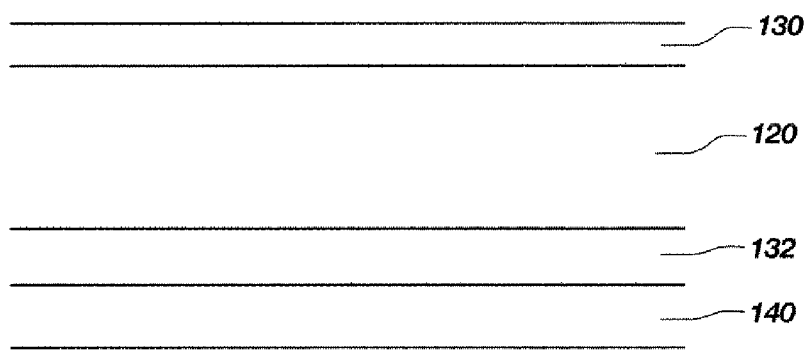

FIGS. 9A-9F depict an example of an embodiment of a method of forming an embodiment of a vertical I-MOS device of the invention, such as the impact ionization device 100' shown in FIG. 5. The impact ionization device 100' (FIG. 9F) may be formed by providing a substrate 120, which may optionally comprise a buried oxide layer 140. Dopants may then be implanted into the substrate 120 to form the source and drain regions 130, 132. Referring to FIG. 9A, a first, deep ion implantation process may be performed to form the N+ drain region 132. As shown in FIG. 9B, a second, relatively shallow ion implantation process may be performed to form the P+ source region 130 on an upper surface of the substrate 120, which is shown in FIG. 9C. In this configuration, the source and drain regions 130, 132 are formed of opposite conductivity type (N or P).

Figure 9D:
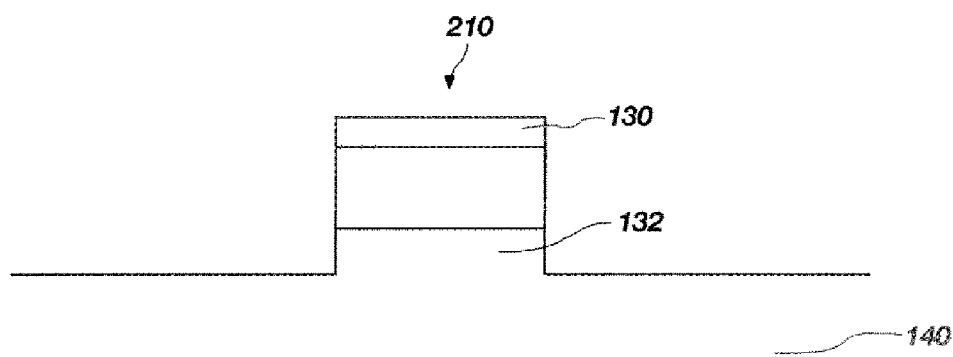
Figure 9E:
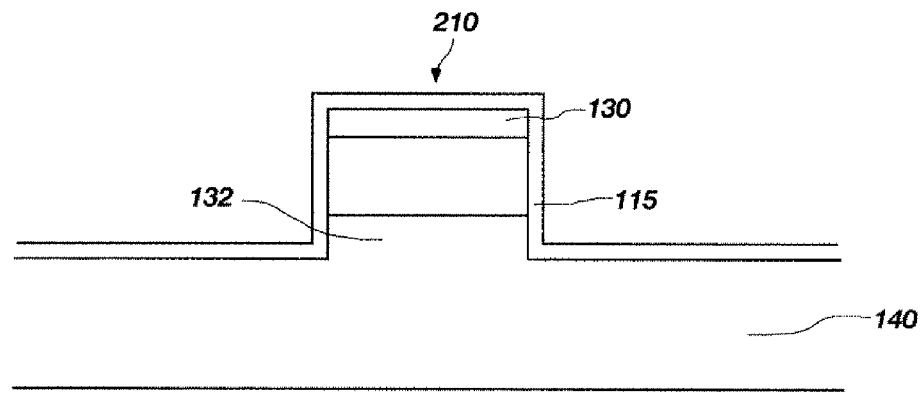

After implantation, the substrate 120 may be masked and etched to form a pillar 210, as shown in FIG. 9D. Next, gate dielectric material 115 may be provided over the substrate 120 and pillar 210, as shown in FIG. 9E. The gate dielectric material 115 may comprise any of the gate dielectric materials 115 previously described in relation to the impact ionization device 100, and may be formed using any of the methods previously described in relation to the impact ionization device 100.

Figure 9F:
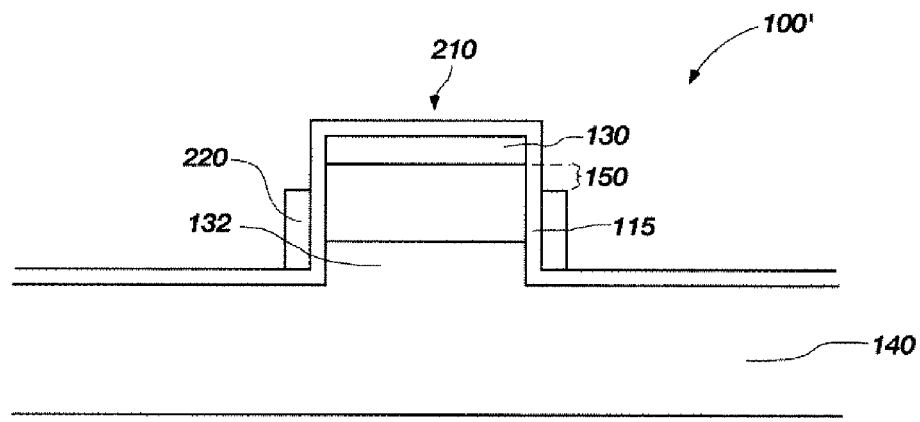

Referring to FIG. 9F, a gate material (not shown) may be deposited and then recessed (e.g., etched) to form a gate 220. A layer of gate material may be deposited over the silicon pillar 210. The layer of gate material may comprise conductive polysilicon (which may be doped) or any other conductive gate material. The layer of gate material may be formed using, for example, low pressure chemical vapor deposition (LPCVD) or other conventional methods. If the layer of gate material comprises a doped material (e.g., doped polysilicon), the layer of gate material may be doped during formation of the layer of gate material by adding a dopant gas such as phosphine or arsine to the CVD source gas mixture, or the layer of gate material may be doped after forming the layer of gate material by implanting ions into the gate material to render the layer of gate material conductive. In additional embodiments, the gate material may be or comprise other materials, such as TaSiN, TiN, TaN, a metal, or any combination thereof (e.g., a multi-layer structure comprising a plurality of layers of such materials), which may prevent a depletion layer from occurring and provide low gate resistance. The gate material may be etched to form the gate 220 by any conventional method such as plasma etching or wet chemical etching.

Figure 10:
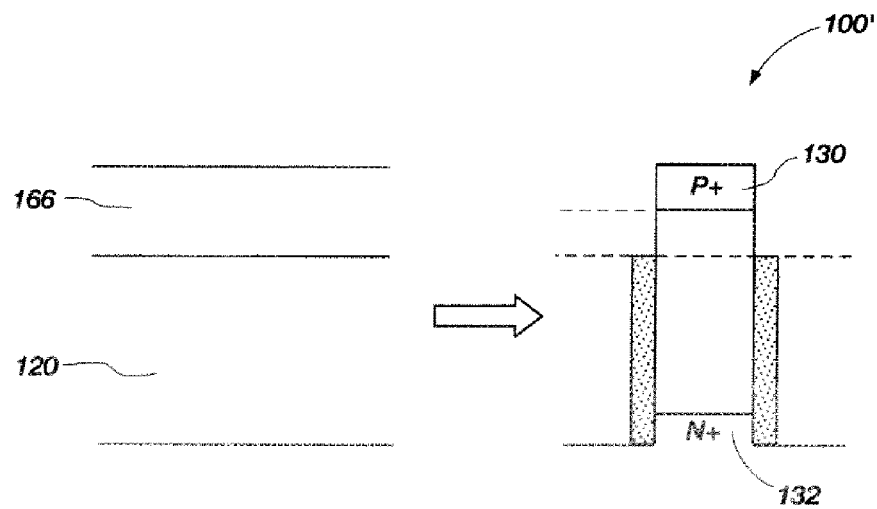
FIG. 10 is a cross-sectional view of an embodiment of a vertical I-MOS transistor of the invention.

In some embodiments of the invention, the impact ionization device 100' may include a material 166 on a surface of the substrate 120, as shown in FIG. 10. By way of example and not limitation, prior to doping, the material 166 may be formed on an upper surface of the substrate 120. The P+ source region 130 may be located in an upper portion of the layer of material 166 such at the region between a lower surface of the P+ source region 130 and the lower level of the layer of material 166 creates the impact ionization region 150. By way of example and not limitation, the layer of material 166 may include any material having an impact ionization rate relatively higher than that of silicon, such as, but not limited to, germanium and silicon germanium alloys. As one particular nonlimiting example, the layer of material 166 may comprise a layer of epitaxial silicon germanium (SiGe). Since SiGe has a higher impact ionization rate tan silicon, the threshold voltage of the impact ionization device 100' may be lowered relative to previously known I-MOS devices.

The impact ionization devices according to embodiments of the invention may be formed using conventional processing techniques. The devices require a lower threshold voltage than conventional MOSFET devices while maintaining a footprint equal to or less than conventional MOSFET devices. The impact ionization devices according to embodiments of the invention have superior scalability to prior art devices and may have dimensions of about 100 nm or less.

While the impact ionization devices have been described with respect to MOSFET devices, it will be understood that the methods and structures disclosed herein may be applied to any impact ionization device.

The invention is susceptible to various modifications and alternative forms in addition to specific embodiments shown by way of example in the drawings and described in detail herein. Thus, the invention is not limited to the particular forms disclosed. Rather, the scope of the invention encompasses all modifications, equivalents, and alternatives falling within the following appended claims.

What is claimed is:

1. An impact ionization device, comprising:
a gate disposed in a trench in a substrate;
an insulating material disposed within the trench over the gate;
a drain region on a first side of the trench, at least a portion of the drain region laterally adjacent the gate;
a source region on a second side of the trench laterally adjacent the insulating material, a a lower boundary of the source region vertically separated from an upper surface of the gate, the drain region being N+ type or P+ type and the source region being N+ type or P+ type where the drain region is not the same type as the source region; and
an impact ionization region on the second side of the trench, and between a plane defined by the lower boundary of the source region and another plane defined by the upper surface of the gate.

2. The impact ionization device of claim 1, further comprising another insulating material separating both the gate and the insulating material from sidewalls of the trench.

3. The impact ionization device of claim 1, wherein the impact ionization region comprises a germanium material.

4. The impact ionization device of claim 1, wherein the gate is less than 100 nm wide.

5. A transistor comprising;
a substrate having a trench in a surface thereof;
a gate within the trench;
an N-type drain region outside of the trench and laterally adjacent an upper boundary of the gate;
a P-type source region outside of the trench, a lower boundary of the P-type source region vertically separated from a lower boundary of the N-type drain region and the upper boundary of the gate; and
an impact ionization region vertically confined between the upper boundary of the gate and the lower boundary of the P-type source region.

6. The transistor of claim 5, wherein the impact ionization region comprises a germanium material.

7. The transistor of claim 5, wherein the gate comprises doped polysilicon material.

8. The transistor of claim 5, wherein the transistor exhibits a subthreshold slope between 0 mV/decade and 60 mV/decade.

9. The impact ionization device of claim 1, wherein the impact ionization region is vertically confined between the plane defined by the lower boundary of the source region and the another plane defined by the upper surface of the gate.

10. The impact ionization device of claim 1, wherein the plane defined by the lower boundary of the source region vertically overlies the another plane defined by the upper surface of the gate.

11. The impact ionization device of claim 1, wherein the impact ionization region consists of a material on an upper surface of the substrate.

12. The impact ionization device of claim 1, wherein the drain region vertically extends below the impact ionization region and into the substrate.

13. The impact ionization device of claim 1, wherein an upper surface of the insulating material is level with a top of the trench.

14. The impact ionization device of claim 1, wherein the insulating material comprises a nitride.

15. The impact ionization device of claim 1, wherein the insulating material comprises aluminum oxide.

16. The impact ionization device of claim 1, wherein the drain region extends below the insulating material.

17. The impact ionization device of claim 1, wherein the gate material comprises at least one of TaSiN, TiN, TaN, HfN, WN, MoN, a metal, a metal alloy, and a metal oxide.

18. The impact ionization device of claim 2, wherein the insulating material and the another insulating material are different than one another.

* * * * *

UNITED STATES PATENT AND TRADEMARK OFFICE
CERTIFICATE OF CORRECTION

PATENT NO. : 8,674,434 B2  
APPLICATION NO. : 12/053977  
DATED : March 18, 2014  
INVENTOR(S) : Venkatesan Ananthan Page 1 of 1

It is certified that error appears in the above-identified patent and that said Letters Patent is hereby corrected as shown below:

On the title page, in item (57), under "Abstract", in column 2, line 5, delete "MOSET" and insert -- MOSFET --, therefor.

In the Claims

In column 7, line 38, in claim 1, delete "a a lower" and insert -- a lower --, therefor.

Signed and Sealed this  
Twenty-ninth Day of July, 2014

Michelle K. Lee  
*Deputy Director of the United States Patent and Trademark Office*